United States Patent
Xiong et al.

(10) Patent No.: US 10,211,263 B2
(45) Date of Patent: Feb. 19, 2019

(54) DISPLAY DEVICE AND MANUFACTURE METHOD THEREOF

(71) Applicants: SHANGHAI TIANMA AM-OLED CO., LTD., Shanghai (CN); TIANMA MICRO-ELECTRONICS CO., LTD., Shenzhen (CN)

(72) Inventors: Zhiyong Xiong, Shanghai (CN); Yongzhi Wang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 3 days.

(21) Appl. No.: 15/251,376

(22) Filed: Aug. 30, 2016

(65) Prior Publication Data
US 2017/0141163 A1   May 18, 2017

(30) Foreign Application Priority Data
Nov. 18, 2015 (CN) .......................... 2015 1 0794028

(51) Int. Cl.
*H01L 27/32* (2006.01)
*G09G 3/3258* (2016.01)
(Continued)

(52) U.S. Cl.
CPC ....... *H01L 27/3218* (2013.01); *G09G 3/3258* (2013.01); *H01L 27/3246* (2013.01); *H01L 27/3258* (2013.01); *H01L 27/3276* (2013.01); *H01L 51/5209* (2013.01); *H01L 51/5225* (2013.01); *G09G 2300/0452* (2013.01);
(Continued)

(58) Field of Classification Search
CPC ............. H01L 27/3218; H01L 27/3246; H01L 27/3258; H01L 27/3276
See application file for complete search history.

(56) References Cited

U.S. PATENT DOCUMENTS

2011/0297943 A1   12/2011  Kim et al.
2014/0197396 A1*  7/2014  Madigan ............ H01L 51/0005
                                                         257/40
2014/0312319 A1   10/2014  Kim

FOREIGN PATENT DOCUMENTS

| CN | 101887188 A   | 11/2010 |
| CN | 104282721 A   | 1/2015  |
| KR | 20110132816 A | 12/2011 |

* cited by examiner

*Primary Examiner* — Douglas M Menz
(74) *Attorney, Agent, or Firm* — Kilpatrick Townsend & Stockton LLP (57) ABSTRACT

The present disclosure provides a display device and a manufacture method thereof. The pixel definition layer includes a plurality of openings. The organic light emitting layer includes an opening region of the transparent conductive layer and a non-opening region of the transparent conductive layer. The opening region of the transparent conductive layer † disposed in the plurality of openings of the pixel definition layer. The organic light emitting layer being formed over the opening region of the transparent conductive layer to correspondingly form the plurality of sub-pixels. A three-dimensional recess is disposed in the substrate module below at least one of the color sub-pixels, each three-dimensional recess corresponds to one of the openings. The opening region of the transparent conductive layer and the organic light emitting layer are disposed in the three-dimensional recess.

11 Claims, 7 Drawing Sheets

(51) Int. Cl.
*H01L 51/52* (2006.01)
*H01L 51/50* (2006.01)
(52) U.S. Cl.
CPC ............... *G09G 2300/0465* (2013.01); *G09G 2300/0809* (2013.01); *G09G 2330/021* (2013.01); *H01L 51/5012* (2013.01); *H01L 2227/323* (2013.01)

Fig. 10 producing a substrate module comprising a TFT driving substrate and an insulating layer formed over the TFT driving substrate, and disposing a three-dimensional recess at a region of the substrate module corresponding to at least one of the color sub-pixels 1102 forming a transparent conductive layer at a surface of the insulating layer and the three-dimensional recesses 1104 forming a pixel definition layer over the pixel definition layer, the pixel definition layer comprising a plurality of openings, the three-dimensional recesses respectively corresponding to the openings of the pixel definition layer, a portion of the transparent conductive layer in the openings corresponding to an opening region of the transparent conductive layer, and a portion of the transparent conductive layer between the insulating layer and the pixel definition layer corresponding to a non-opening region of the transparent conductive layer 1106 forming an organic light emitting layer in the plurality of openings, the organic light emitting layer being formed over the transparent conductive layer to correspondingly form the plurality of sub-pixels 1108

DISPLAY DEVICE AND MANUFACTURE METHOD THEREOF

CROSS-REFERENCE TO RELATED APPLICATIONS

The present application is based upon and claims priority to Chinese Patent Application No. CN 201510794028.1 filed Nov. 18, 2015, the entire contents of which are incorporated herein by reference.

TECHNICAL FIELD

The present disclosure relates to a display device and a manufacture method thereof, and more particularly, to a display device which has low power consumption and a manufacture method thereof.

BACKGROUND

In an existing active matrix organic light emitting diode (AMOLED) panel, pixel arrangement is typically real arrangement. Such arrangement is easy for construction, layout design, mask production and production process.

Figure 1A:
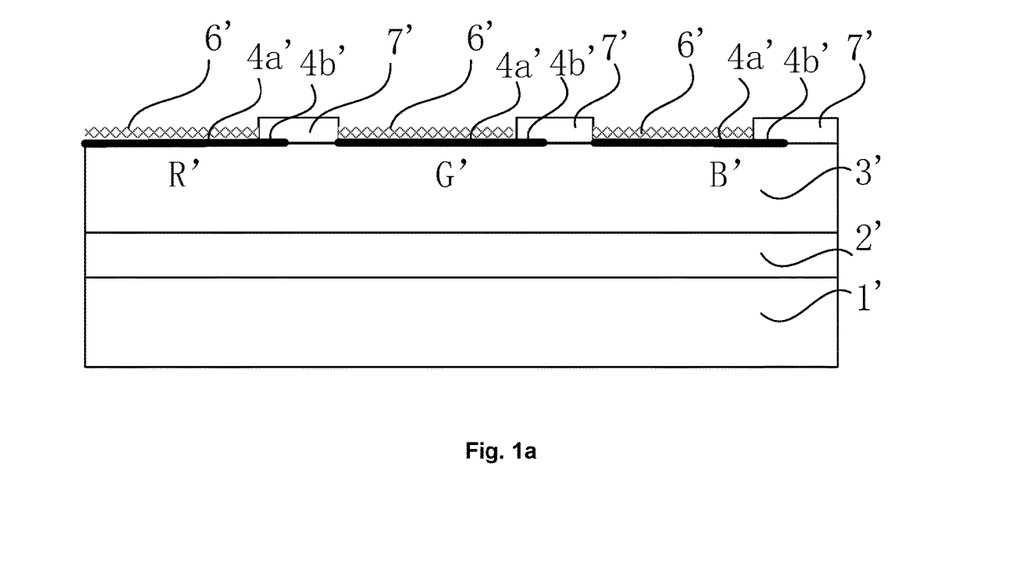
FIG. 1a is a cross sectional view of a single pixel of a display device in the prior art.

As shown in FIG. 1a, a conventional AMOLED panel includes a substrate module 1', a passivation layer 2', a planarization layer 3', a pixel definition layer 7', a transparent conductive layer 4' and an organic light emitting layer 6'. The passivation layer 2' is formed over the substrate module 1', and the planarization layer 3' is formed over the passivation layer 2'. The pixel definition layer 7' is formed over an insulating layer, contains a plurality of openings, and can be disposed at the same layer and made of the same material as the planarization layer 3'. The transparent conductive layer 4' is formed at the surface of the insulating layer, and includes an opening region 4a' and a non-opening region 4b' of the transparent conductive layer. The opening region 4a' of the transparent conductive layer is disposed in the plurality of openings of the pixel definition layer 7', and the non-opening region 4b' of the transparent conductive layer is disposed between the insulating layer and the pixel definition layer 7'. The organic light emitting layer 6' is formed over the opening region 4a' of the transparent conductive layer, to correspondingly form a plurality of sub-pixels. The surface area of the opening region 4a' of the transparent conductive layer or the surface area of the organic light emitting layer 6' is the same as the surface area of the opening. The light emitting area of a single sub-pixel equals to the planarization area of the opening. As shown in FIG. 1a, there are three segments of opening regions 4a' of the transparent conductive layer which are positioned respectively corresponding to a red sub-pixel R', a green sub-pixel G', and a blue sub-pixel B'.

Figure 1B:
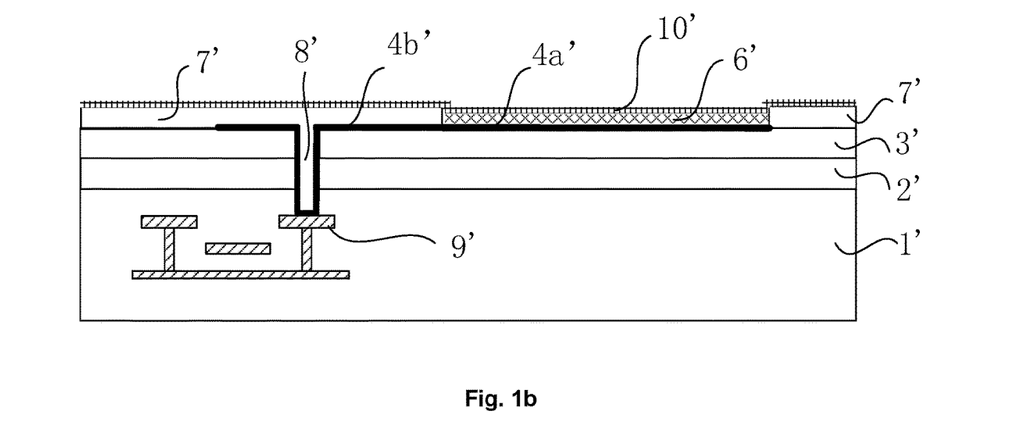
FIG. 1b is a cross sectional view of a single sub-pixel of a display device in the prior art.

In addition, as shown in FIG. 1b, a numeral reference 8' denotes a via hole in the insulating layer, a numeral reference 9' denotes a TFT in a substrate module, and a numeral reference 10' denotes a cathode of an organic light emitting unit. The non-opening region 4b' of the transparent conductive layer is connected to the TFT 9' in the non-opening region through the via hole 8'.

However, with popularity of smart phones, high PPI (high resolution, the number of pixels per inch, Pixels per inch) has become a main objective of AMOLED.

Since light emitting points of pixels of the AMOLED are produced with fine metal mask through a deposition process, when the panel is produced to have a high PPI, aperture ratios of the pixels will be reduced due to the requirements of the process and the limitation of the mask.

Figure 2:
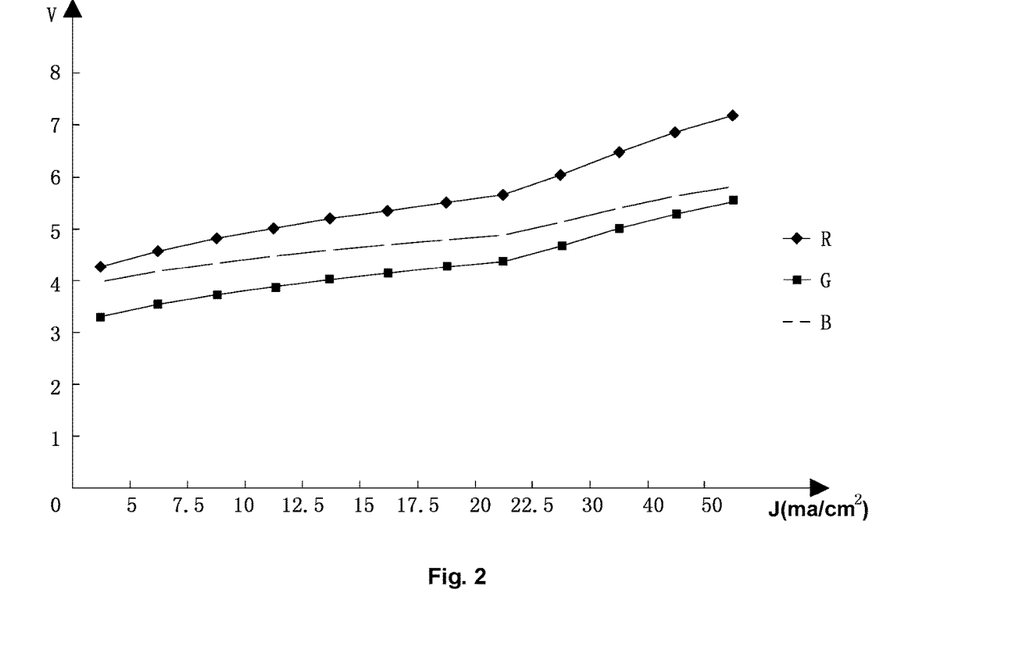
FIG. 2 is a graph of voltage against current density of a display device in the prior art.

When the aperture ratio of the pixels is reduced, the area of the light emitting region will be reduced. In this case, since a current for the entire panel is preset as fixed, a current density for each pixel will be increased. As shown in FIG. 2, from the curve (J-V Curve) of the current density of the AMOLED panel against voltage it can be seen that, the voltage increases with the current density increases.

For example, with two aperture ratios A and B (the aperture ratio B is smaller than the aperture ratio A), reduction in aperture ratios results in about 10% to 15% increase in power consumption of the product. For a portable phone, this change is extremely unfavorable. Then, how to realize high PPI without additionally increase the power consumption has become an important issue.

It is proposed in the industry a color rendering method which can ensure high PPI without reducing the aperture ratio. However, such a method has the following disadvantages.

1. The display effect of rendering is not as good as the real arrangement, and has problem such as slash burr.
2. The circuit (IC) will become complicated, and significantly increase the cost.
3. Lack of core algorithm patents.

In view of the above, the inventor provides a display device which has low power consumption and a manufacture method thereof.

In addition, since in an AMOLED panel of the prior art, each sub-pixel is provided with sufficient voltage margin to ensure the voltage of respective sub-pixel. The sub-pixels requires sufficient voltage margin to ensure the voltage of respective sub-pixels. In this case, some sub-pixels may have a voltage greater than its required voltage, resulting in redundant voltage supplies, and the resulted waste in power consumption may cause a bottleneck in the overall settings.

In order to overcome the above problems, the present disclosure provides a display device which has low power consumption and a manufacture method thereof.

SUMMARY

To overcome the defects in the prior art, the objective of the present disclosure is to provide a display device in which the spatial structure of the pixel region is changed to increase the surface area of the light emitting region, and a manufacture method thereof, which can be applied to various display devices.

A first objective of the present disclosure is: by providing recesses, the light emitting area can be increased, the current density can be decreased and the power consumption can be saved even when the PPI is high and the aperture ratio is decreased.

Another objective of the present disclosure is: by balancing the voltages of the three sub-pixels, the voltage redundant problem can be eliminated or mitigated, thereby saving power consumption.

According to one aspect of the present disclosure, there is provided a display device including a plurality of color sub-pixels. The display device includes: a substrate module including a TFT driving substrate and an insulating layer formed over the TFT driving substrate; a pixel definition layer formed over the insulating layer, the pixel definition layer including a plurality of openings; and an organic light emitting layer formed in the plurality of openings to correspondingly form the plurality of sub-pixels. A three-dimensional recess is disposed in the insulating layer below at least one sub-pixel having a particular color. Each three-dimensional recess corresponds to one opening of the pixel definition layer. The organic light emitting layer is formed in each three-dimensional recess, to correspondingly form the plurality of sub-pixels.

In some embodiments, the display device further includes a transparent conductive layer formed at the surface of the insulating layer. The transparent conductive layer includes an opening region of the transparent conductive layer and a non-opening region of the transparent conductive layer. The opening region of the transparent conductive layer is disposed in the plurality of openings of the pixel definition layer, and the non-opening region of the transparent conductive layer being disposed between the insulating layer and the pixel definition layer. In each three-dimensional recess, the opening region of the transparent conductive layer is affixed to the surface of the three-dimensional recess, and a portion of the transparent conductive layer in the three-dimensional recess has a surface area larger than a surface area of a corresponding opening of the pixel definition layer.

In some embodiments, the insulating layer includes a planarization layer, and the three-dimensional recess does not penetrate the planarization layer.

In some embodiments, the insulating layer includes a planarization layer and a passivation layer, and the planarization layer is formed over the passivation layer.

In some embodiments, the three-dimensional recess does not penetrate the planarization layer.

In some embodiments, the three-dimensional recess penetrates the planarization layer, but does not penetrate the passivation layer.

In some embodiments, the plurality of sub-pixels includes a red sub-pixel, a green sub-pixel and a blue sub-pixel, a respective color sub-pixel corresponds to a respective three-dimensional recess of a respective surface area and each of the sub-pixels has the same voltage value.

In some embodiments, the red sub-pixel corresponds to a three-dimensional recess having a surface area larger than a surface area of a three-dimensional recess corresponding to the green sub-pixel.

In some embodiments, the green sub-pixel corresponds to a three-dimensional recess having a surface area larger than a surface area of a three-dimensional recess corresponding to the blue sub-pixel.

In some embodiments, for a color sub-pixel, a current (I), a voltage (V), a current density (J) and an area (S) of a light emitting region have the following basic relationships: $J=F(V)$, $I=JS$, wherein $J=F(V)$ corresponds to a curve of current density against voltage, and a value of the current of the color sub-pixel is a determinable current value in a sub-pixel of an organic light emitting device of a certain type;

In some embodiments, a relationship among the area (S) of the light emitting region, the current (I) and the voltage (V) is $S=[I/F(V)]$, and based on the relationship among the area (S) of the light emitting region, the current (I) and the voltage (V), a surface area of each of the sub-pixels can be determined according to a set voltage.

In some embodiments, the three-dimensional recess is formed of at least one recess of any one form of an inverted trapezoidal groove, a triangular groove, an inverted pyramid-shaped recess, an inverted bevel recess, an inverted vertebral recess and a hemisphere recess.

According to another aspect of the present disclosure, there is provided a manufacture method of a display device, the display device including a plurality of color sub-pixels. The manufacture method includes the following steps: producing a substrate module including a TFT driving substrate and an insulating layer formed over the TFT driving substrate, and disposing a three-dimensional recess at a region of the substrate module corresponding to at least one of the color sub-pixels; forming a transparent conductive layer at a surface of the insulating layer and the three-dimensional recesses; forming a pixel definition layer over the pixel definition layer, the pixel definition layer including a plurality of openings, the three-dimensional recesses respectively corresponding to the openings of the pixel definition layer, a portion of the transparent conductive layer in the openings corresponding to an opening region of the transparent conductive layer, and a portion of the transparent conductive layer between the insulating layer and the pixel definition layer corresponding to a non-opening region of the transparent conductive layer; and forming an organic light emitting layer in the plurality of openings, the organic light emitting layer being formed over the transparent conductive layer to correspondingly form the plurality of sub-pixels.

In some embodiments, the three-dimensional recesses are etched with a grayscale mask.

In some embodiments, the three-dimensional recesses respectively corresponding to the color sub-pixels are etched at separate times.

In some embodiments, the three-dimensional recesses are disposed in the insulating layer, the opening region of the transparent conductive layer is affixed to the surface of each three-dimensional recess, and a portion of the transparent conductive layer in the three-dimensional recess has a surface area larger than a surface area of a corresponding opening of the pixel definition layer.

In some embodiments, the insulating layer includes a planarization layer, and the three-dimensional recess does not penetrate the planarization layer when the three-dimensional recess is etched.

In some embodiments, the insulating layer includes a planarization layer and a passivation layer, and the planarization layer is formed over the passivation layer.

In some embodiments, the three-dimensional recess does not penetrate the planarization layer when the three-dimensional recess is etched.

In some embodiments, the three-dimensional recess penetrates the planarization layer, but does not penetrate the passivation layer when the three-dimensional recess is etched.

In some embodiments, the three-dimensional recess is formed of at least one recess of any one form of an inverted trapezoidal groove, a triangular groove, an inverted pyramid-shaped recess, an inverted bevel recess, an inverted vertebral recess and a hemisphere recess.

In the display device and the manufacture method thereof according to the present disclosure, the spatial structure of the pixel region is changed to increase the surface area of the light emitting region, which can be applied to various display devices. In this way, the light emitting area is increased, the current density is decreased and the power consumption can be saved even when the PPI is high and the aperture ratio is decreased.

BRIEF DESCRIPTION OF THE DRAWINGS

Other features, objectives and advantages of the present disclosure will become apparent from the detailed description of non-limiting embodiments with reference to the following accompanying drawings.

DETAILED DESCRIPTION

Exemplary embodiments will now be more fully described with reference to the accompanying drawings. However, the exemplary embodiments can be implemented in various forms, and should not be understood as limited to the embodiments set forth herein. On the contrary, these embodiments are provided to make the present disclosure thorough and complete, and to fully convey the concept of the exemplary embodiments to those skilled in the art. Similar numeral reference denotes similar or same parts throughout the accompanying drawings, and repeat description thereof will be omitted.

The features, structures or characteristics described herein can be combined in one or more embodiments through any appropriate manner. In the following description, specific details are provided for thorough understanding of the present disclosure. However, those skilled in the art should appreciate that the technical solution of the present disclosure can also be practiced without one or more of the particular details, or with other methods, components or materials. In some circumstances, known structures, material or operation will not be illustrated or described in detail to avoid obscuring the present disclosure.

Figure 3A:
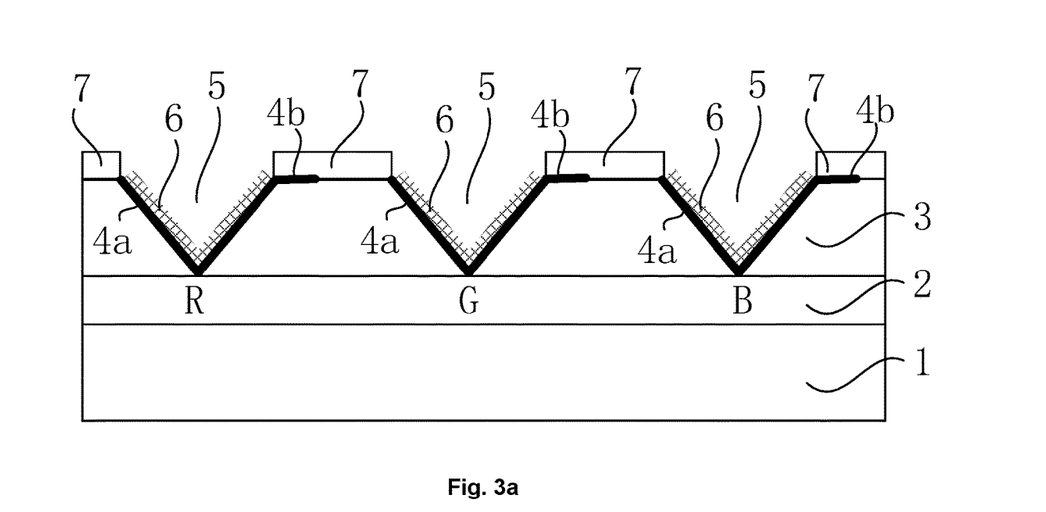
FIG. 3a is a cross sectional view of a single pixel of a first display device according to the present disclosure.

As shown in FIG. 3a, a display device of the present disclosure includes a substrate module 1, a passivation layer 2, a planarization layer 3, a pixel definition layer 7, a transparent conductive layer 4 and an organic light emitting layer 6. The passivation layer 2 is formed over the substrate module 1, and the planarization layer 3 is formed over the passivation layer 2. The pixel definition layer 7 is formed over an insulating layer, contains a plurality of openings, and can be disposed at the same layer and made of the same material as the planarization layer 3. The transparent conductive layer 4 is formed at the surface of the insulating layer, includes an opening region 4a and a non-opening region 4b of the transparent conductive layer. The opening region 4a of the transparent conductive layer is disposed in the plurality of openings of the pixel definition layer 7, and the non-opening region 4b of the transparent conductive layer is disposed between the insulating layer and the pixel definition layer 7. The organic light emitting layer 6 is formed over the opening region 4a of the transparent conductive layer, to correspondingly form a plurality of sub-pixels. Below at least one sub-pixel having a particular color, a three-dimensional recess 5 is provided in the substrate module 1, and each three-dimensional recess 5 corresponds to an opening of the pixel definition layer 7. The opening region 4a of the transparent conductive layer is disposed on the surface of the three-dimensional recess 5. The organic light emitting layer 6 is formed over the opening region 4a of the transparent conductive layer to correspondingly form a plurality of sub-pixels, and formed on the three-dimensional surface of the three-dimensional recess 5. In case where each of the sub-pixels occupies the same planar surface area, the three-dimensional surface of the present disclosure has a surface area greater than the surface area of the planar surface in the prior art. The three-dimensional recess 5 is disposed inside the insulating layer, and the opening region 4a of the transparent conductive layer is affixed to a surface of each three-dimensional recess 5. The surface area of the opening region 4a of the transparent conductive layer in the three-dimensional recess 5 is larger than the surface corresponding to the pixel definition layer 7. Three segments of opening regions 4a of the transparent conductive layer respectively correspond to a red sub-pixel R, a green sub-pixel G, and a blue sub-pixel B. The display device of the present disclosure can be applied to a panel of any structure, such as a curve panel or a planar panel, which is not limited in the present disclosure.

Figure 3B:
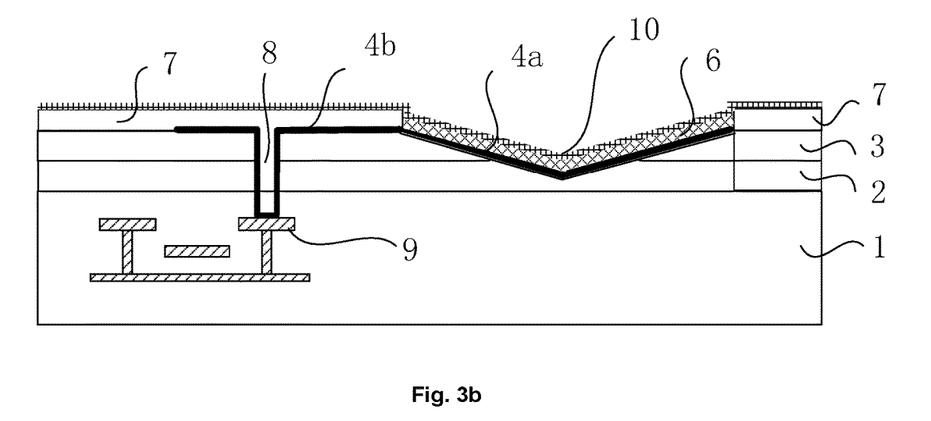
FIG. 3b is a cross sectional view of a single sub-pixel of a first display device according to the present disclosure.

In addition, as shown in FIG. 3b, a numeral reference 8 denotes a via hole in the insulating layer, a numeral reference 9 denotes a TFT in a substrate module, and a numeral reference 10 denotes a cathode of an organic light emitting unit. The non-opening region 4b of the transparent conductive layer is connected to the TFT 9 in the non-opening region through the via hole 8.

In the present embodiment, the insulating layer includes the planarization layer 3, and the three-dimensional recess 5 does not penetrate the planarization layer 3. Alternatively, the insulating layer can include the planarization layer 3 and the passivation layer 2, and the planarization layer 3 can be formed over the passivation layer 2. In this case, it is possible that the three-dimensional recess 5 does not penetrate the planarization layer 3, or the three-dimensional recess 5 penetrates the planarization layer 3 but does not penetrate the passivation layer 2. The three-dimensional recess 5 is formed of at least one recess of any one form of an inverted trapezoidal groove, a triangular groove, an inverted pyramid-shaped recess, an inverted bevel recess, an inverted vertebral recess and a hemisphere recess.

Below are some specific configurations of the three-dimensional recess 5, however, the present disclosure is not limited thereto.

Again, referring to FIG. 3a, the three segments of opening regions 4a of the transparent conductive layer are positioned respectively corresponding to three sub-pixels R, G and B (i.e. a red sub-pixel R, a green sub-pixel G and a blue sub-pixel B, not shown). The three-dimensional recess 5 of each sub-pixel is a triangular groove, the opening region 4a of the transparent conductive layer and the organic light emitting layer 6 are disposed on the surface of the triangular groove, and each triangular groove does not penetrate the planarization layer 3.

Figure 4:
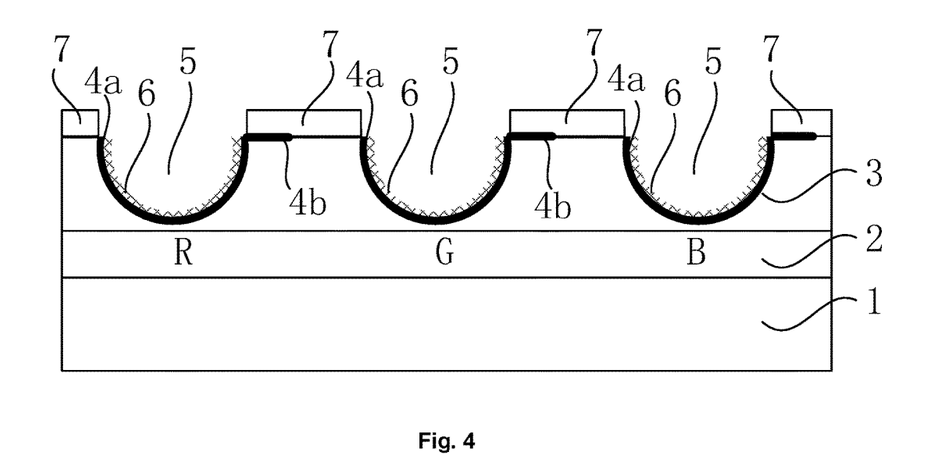
FIG. 4 is a cross sectional view of a single pixel of a second display device according to the present disclosure.

As shown in FIG. 4, the opening regions 4a of the transparent conductive layer are positioned respectively corresponding to the red sub-pixel R, the green sub-pixel G and the blue sub-pixel B. The three-dimensional recess 5 of each sub-pixel is a hemisphere recess, the opening region 4a of the transparent conductive layer and the organic light emitting layer 6 are disposed on the surface of the hemisphere recess, and each hemisphere recess does not penetrate the planarization layer 3.

Figure 5:
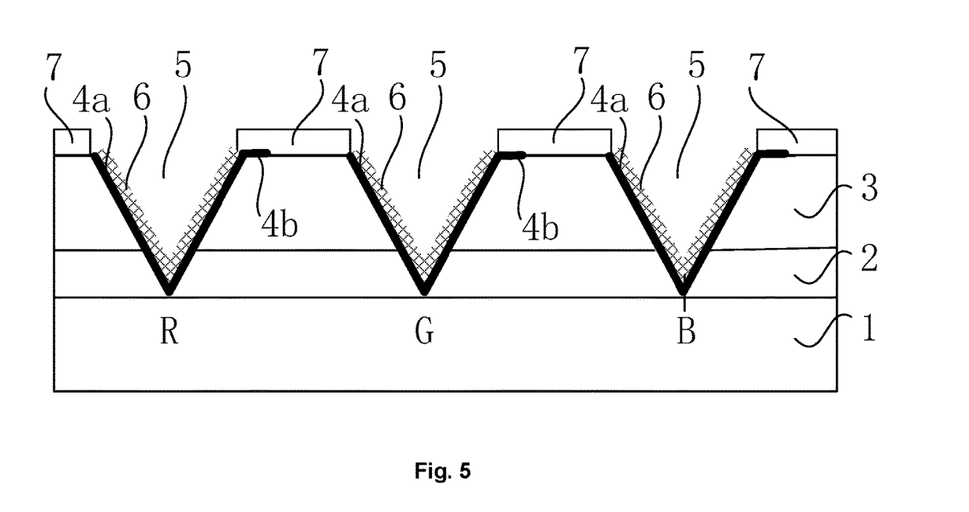
FIG. 5 is a cross sectional view of a single pixel of a third display device according to the present disclosure.

As shown in FIG. 5, the opening regions 4a of the transparent conductive layer are positioned respectively corresponding to the red sub-pixel R, the green sub-pixel G and the blue sub-pixel B. The three-dimensional recess 5 of each sub-pixel is a deep triangular groove, the opening region 4a of the transparent conductive layer and the organic light emitting layer 6 are disposed on the surface of the deep triangular groove, and each deep triangular groove penetrates the planarization layer 3, but does not penetrate the passivation layer 2.

Figure 6:
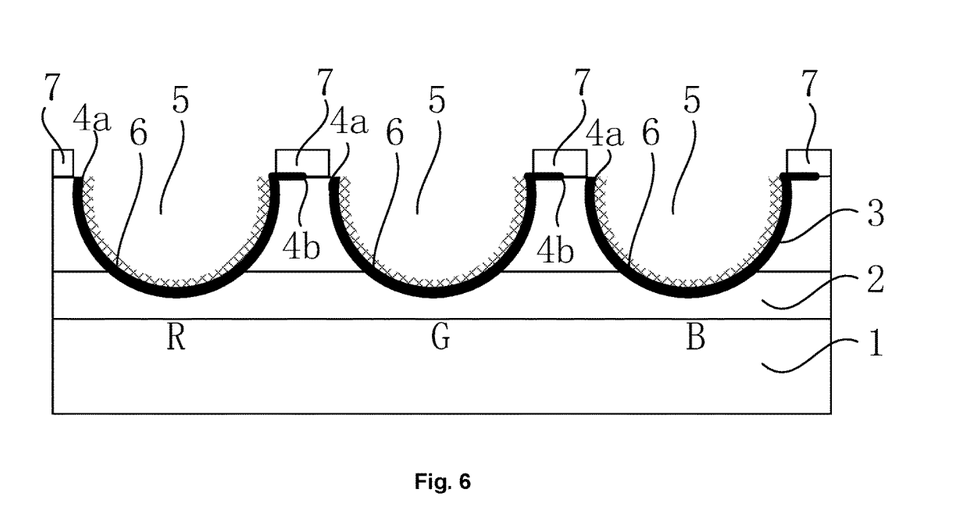
FIG. 6 is a cross sectional view of a single pixel of a fourth display device according to the present disclosure.

As shown in FIG. 6, the three segments of opening regions 4a of the transparent conductive layer are positioned respectively corresponding to the red sub-pixel R, the green sub-pixel G and the blue sub-pixel B. The three-dimensional recess 5 of each sub-pixel is a deep hemisphere recess, the opening region 4a of the transparent conductive layer and the organic light emitting layer 6 are disposed on the surface of the deep hemisphere recess, and each deep hemisphere recess penetrates the planarization layer 3, but does not penetrate the passivation layer 2.

Figure 7:
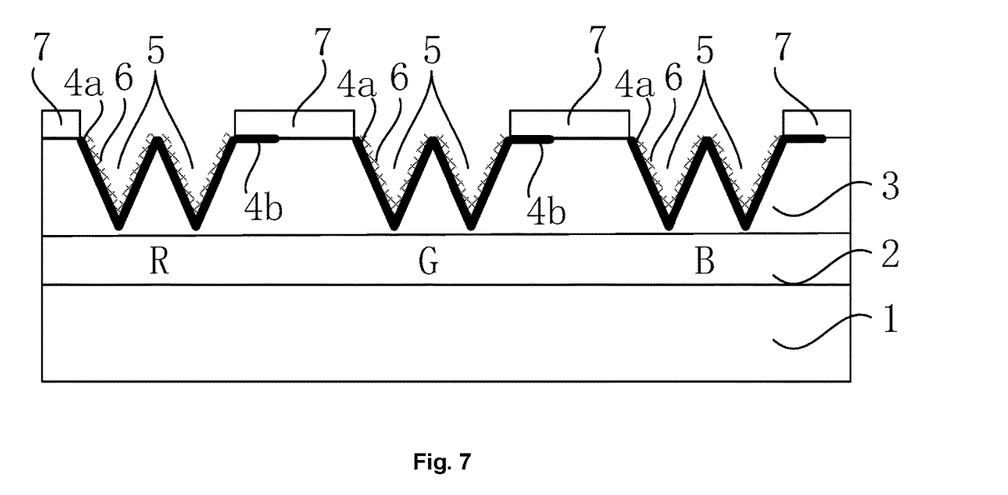
FIG. 7 is a cross sectional view of a single pixel of a fifth display device according to the present disclosure.

As shown in FIG. 7, the three segments of opening regions 4a of the transparent conductive layer are positioned respectively corresponding to the red sub-pixel R, the green sub-pixel G and the blue sub-pixel B. The three-dimensional recess 5 of each sub-pixel is successive double triangular grooves, the opening region 4a of the transparent conductive layer and the organic light emitting layer 6 are disposed on the surface of the successive triangular grooves, and each triangular groove does not penetrate the planarization layer 3.

Figure 8:
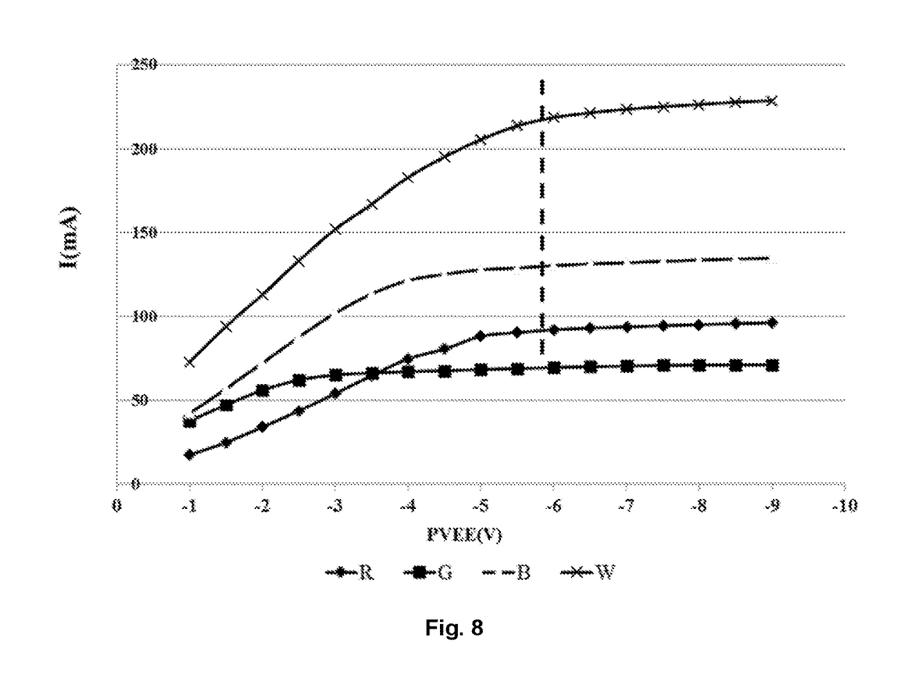
FIG. 8 is a graph of voltage against current of a display device according to the present disclosure.

Referring to the graph of voltage against current density as shown in FIG. 2 and the graph of voltage against current as shown in FIG. 8, for a color sub-pixel, a current (I), a voltage (V), a current density (J), and an area (S) of a light emitting region have the following basic relationships: J=F (V), I=JS, wherein J=F(V) corresponds to a curve of current density against voltage, and a value of the current of the sub-pixel is a determinable current value of a sub-pixel of an organic light emitting device of a certain type.

From the above relationships and curve, for a display device, when the resolution increases and the aperture ratio decreases, the light emitting area of the corresponding sub-pixel decreases, the current density of the sub-pixel increases, the voltage increases and the power consumption increases.

Compared with the planar apertures in the prior art, in the present disclosure, by providing the three-dimensional recess 5, even when the PPI is high and the aperture ratio is decreased, the area of the light emitting area of each sub-pixel can be effectively increased, the current density can be decreased and the voltage is decreased, thereby decreasing power consumption.

On the other hand, again, referring to the graph of voltage against current density as shown in FIG. 2 and the graph of voltage against current as shown in FIG. 8, when the area of each sub-pixel is the same, voltage required by each sub-pixel is different. In the prior art, an AMOLED panel is typically designed with a predetermined overall voltage thereacross, the sub-pixels requires sufficient voltage margin, to ensure voltage for each sub-pixel. With this configuration, some sub-pixels may have voltages larger than what are required, resulting in redundant voltage supplies, and the resulted waste in power consumption becomes a bottleneck in the overall settings.

In view of the above, the present disclosure provides different surface areas for different sub-pixels to balance the voltages of the different sub-pixels, thereby to solve the redundant problem and save power consumption.

The settings of surface areas of different sub-pixels can be performed as follows.

The same or the similar voltage value is set for different sub-pixels, a current density value (J) corresponding to each sub-pixel is obtained from the curve "J=F(V)", and then a corresponding area of the light emitting region of each sub-pixel is obtained based on the obtained current value of each sub-pixel and from the relationship "I=JS".

Figure 9:
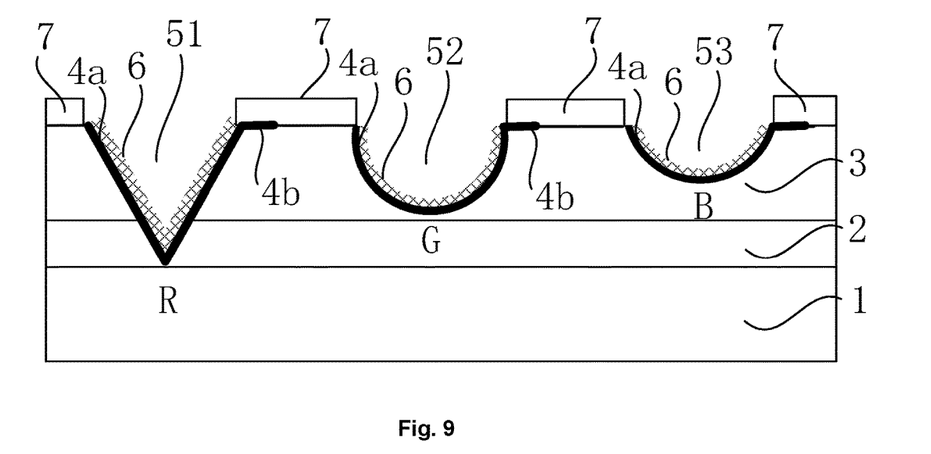
FIG. 9 is a cross sectional view of a single pixel of a sixth display device according to the present disclosure.

As shown in FIG. 9, the sub-pixels include a red sub-pixel R, a green sub-pixel G and a blue sub-pixel B. The three-dimensional recess corresponding to different color sub-pixels have different areas such that the different color sub-pixels have the same voltage. For example, a three-dimensional recess 51 corresponding to the red sub-pixel R has an area larger than an area of a three-dimensional recess 52 corresponding to the green sub-pixel G, and the present disclosure is not limited thereto. The three-dimensional recess 52 corresponding to the green sub-pixel G has an area larger than an area of a three-dimensional recess 53 corresponding to the blue sub-pixel B, and the present disclosure is not limited thereto Again, referring to FIG. 9, the three segments of opening regions 4a of the transparent conductive layer are positioned respectively corresponding to the red sub-pixel R, the green sub-pixel G and the blue sub-pixel B. The three-dimensional recess 51 of the red sub-pixel R is a deep triangular groove, and the deep triangular groove penetrates the planarization layer 3, but does not penetrate the passivation layer 2. Each of the three-dimensional recess 52 of the green sub-pixel G and the three-dimensional recess 53 of the blue sub-pixel B is a hemisphere recess, and each hemisphere recess does not penetrate the planarization layer 3. The three-dimensional recess 52 of the green sub-pixel G is deeper than the three-dimensional recess 53 of the blue sub-pixel B. The three-dimensional recess 51 (the surface area of the triangular groove) of the red sub-pixel R has a surface area larger than that of the three-dimensional recess 52 (the deep hemisphere recess) of the green sub-pixel G, and the three-dimensional recess 52 (the deep hemisphere recess) of the green sub-pixel G has an area larger than that of the three-dimensional recess 53 (the shallow hemisphere recess) of the blue sub-pixel B. Therefore, the opening region 4a of the transparent conductive layer (or the organic light emitting layer 6) in the three-dimensional recess 51 of the red sub-pixel R has a surface area larger than a surface area of the opening region 4a of the transparent conductive layer (or the organic light emitting layer 6) in the three-dimensional recess 52 of the green sub-pixel G, and the opening region 4a of the transparent conductive layer (or the organic light emitting layer 6) in the three-dimensional recess 52 of the green sub-pixel G has a surface area larger than a surface area of the opening region 4a of the transparent conductive layer (or the organic light emitting layer 6) in the three-dimensional recess 53 of the blue sub-pixel B.

In accordance with the present disclosure, the surface areas of different color sub-pixels are adjusted to avoid any one of the sub-pixels having a voltage larger than required. The arrangement of different surface areas makes the three sub-pixels to have voltages substantially equal to one another. Therefore, it can prevent the redundant voltage supply problem, reduce waste in power consumption and avoid bottleneck in the overall settings.

Figure 10:
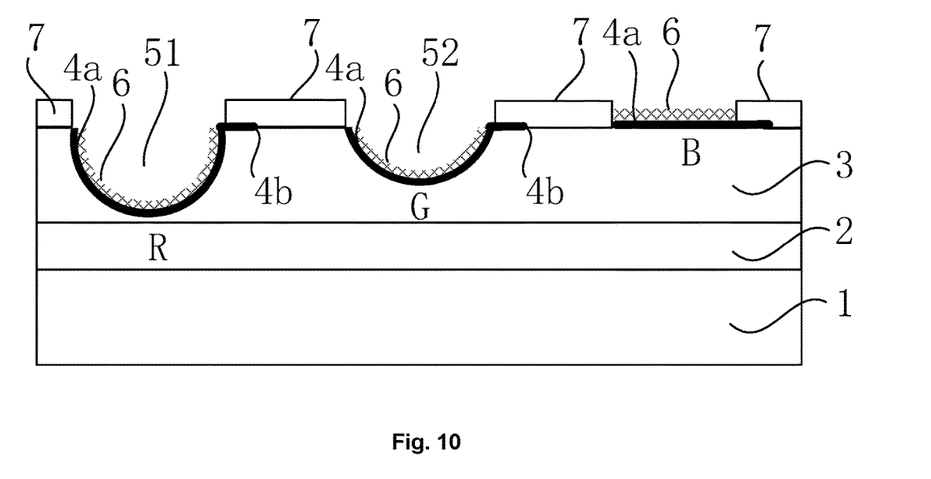
FIG. 10 is a cross sectional view of a single pixel of a seventh display device according to the present disclosure.

As shown in FIG. 10, the three segments of opening regions 4a of the transparent conductive layer are positioned respectively corresponding to the red sub-pixel R, the green sub-pixel G and the blue sub-pixel B. The three-dimensional recess 51 of the red sub-pixel R and the three-dimensional recess 52 of the green sub-pixel G are hemisphere recesses, and each hemisphere recess does not penetrate the planarization layer 3. The three-dimensional recess 51 of the red sub-pixel R is deeper than the three-dimensional recess 52 of the green sub-pixel G. The blue sub-pixel B (i.e. a location corresponding to the middle opening region 4a of the transparent conductive layer) can be a conventional plane. The three-dimensional recess 51 of the red sub-pixel R (the deep hemisphere recess) has a surface area larger than that of the three-dimensional recess 52 (the shallow hemisphere recess) of the green sub-pixel G, and the three-dimensional recess 52 (the shallow hemisphere recess) of the green sub-pixel G has a surface area larger than that of the three-dimensional recess 53 (the plane) of the blue sub-pixel B. The embodiment as shown in FIG. 10 can produce a similar effect to that of FIG. 9, which will not be repeated herein.

Figure 11:
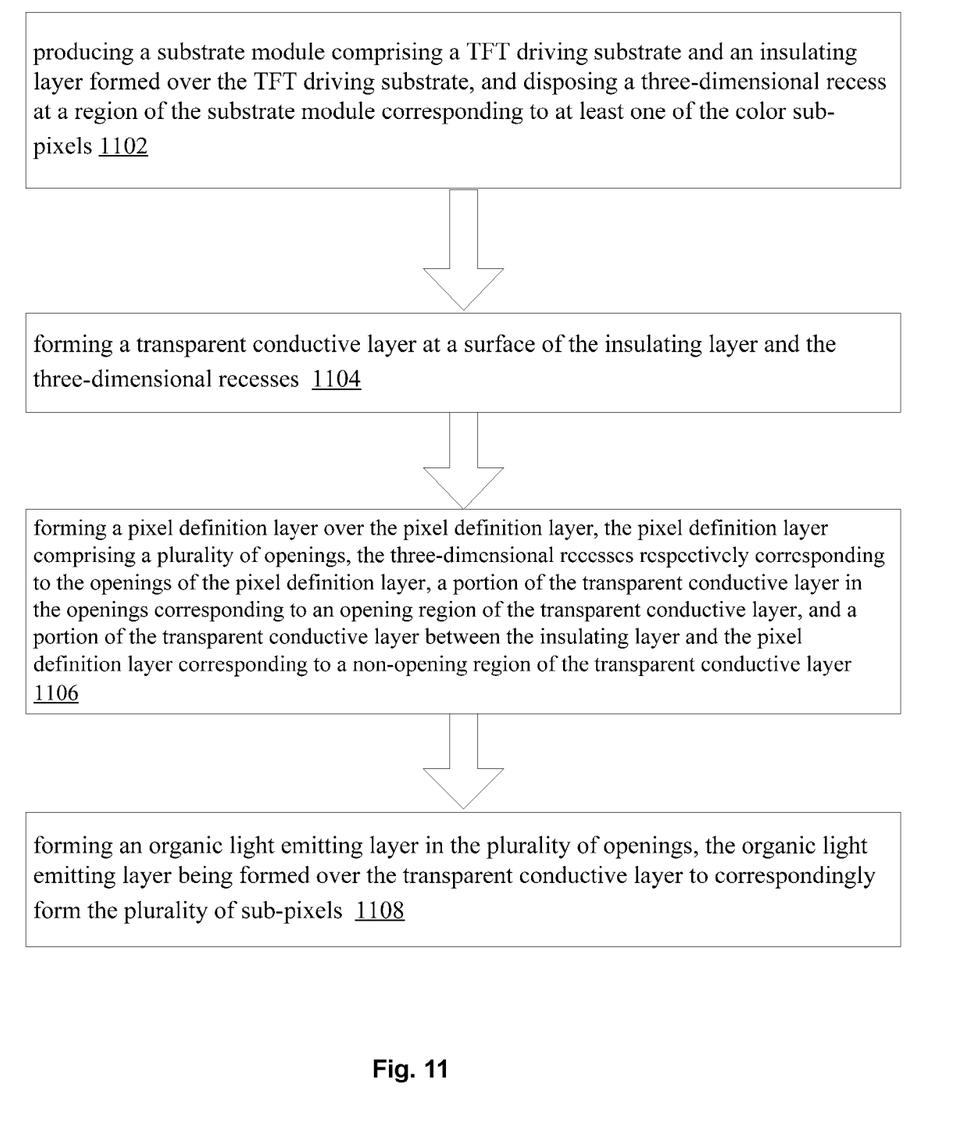
FIG. 11 is a manufacture method of a display device according to the present disclosure.

FIG. 11 is a manufacture method migration monitor 1100 of a display device including a plurality of sub-pixels according to the present disclosure. The method 1100 is characterized by including the following steps:

At 1102, a substrate module including a TFT driving substrate and an insulating layer formed over the TFT driving substrate is produced, and a three-dimensional recess is disposed at a region of the substrate module corresponding to at least one of the color sub-pixels.

At 1104, a transparent conductive layer is formed at a surface of the insulating layer and the three-dimensional recesses.

At 1106, a pixel definition layer is formed over the pixel definition layer. The pixel definition layer includes a plurality of openings, the three-dimensional recesses respectively corresponding to the openings of the pixel definition layer, a portion of the transparent conductive layer in the openings corresponding to an opening region of the transparent conductive layer, and a portion of the transparent conductive layer between the insulating layer and the pixel definition layer corresponding to a non-opening region of the transparent conductive layer; and At 1108, an organic light emitting layer is formed in the plurality of openings, the organic light emitting layer being formed over the transparent conductive layer to correspondingly form the plurality of sub-pixels.

The three-dimensional recess is disposed below at least a sub-pixel having a particular color. Each three-dimensional recess corresponds to one opening of the pixel definition layer 7. The opening region 4a of the transparent conductive layer and the organic light emitting layer 6 are formed in the three-dimensional recess. The three-dimensional recess is disposed in the insulating layer, and the opening region 4a of the transparent conductive layer is affixed to the surface of the three-dimensional recess, and the opening region 4a of the transparent conductive layer has a surface area larger than a area of a corresponding opening of the pixel definition layer 7. The three-dimensional recess is formed of at least one recess of any one form of an inverted trapezoidal groove, a triangular groove, an inverted pyramid-shaped recess, an inverted bevel recess, an inverted vertebral recess and a hemisphere recess.

The three-dimensional recesses are etched with a gray-scale mask, however, the present disclosure is not limited thereto. During the process of forming the three-dimensional recesses, the three-dimensional recesses respectively corresponding to the color sub-pixels are etched at separate times, however, the present disclosure is not limited thereto.

If the insulating layer includes a planarization layer 3, the three-dimensional recess does not penetrate the planarization layer 3 when the three-dimensional recess is etched. If the insulating layer includes a planarization layer 3 and a passivation layer 2, the planarization layer 3 is formed over the passivation layer 2, however, the present disclosure is not limited thereto. The three-dimensional recess may not penetrate the planarization layer 3 when the three-dimensional recess is etched. Alternatively, the three-dimensional recess penetrates the planarization layer 3, but does not penetrate the passivation layer 2 when the three-dimensional recess is etched, however, the present disclosure is not limited thereto.

The present disclosure is not bound by the idea of the planar pixel construction in the prior art, and provides a new method which can ensure real arrangement of the high PPI without decreasing current density. By providing a three-dimensional "recess structure" in a sub-pixel, a "surface area" of a light emitting point can be increased. Thereby, the current density and thus the voltage will not be increased, and the power consumption will not be increased.

In conclusion, the display device and a manufacture method thereof of the present disclosure changes spatial structure of the pixel region, increases the surface area of the light emitting region, and can be applied to various display device. Even with a high PPI, the current density will not be increased, and the voltage and the power consumption will not be increased.

The above is detailed description of the present disclosure with reference to preferred embodiments. It should not be understood that the specific implementation of the present disclosure is limited to the description. Those skilled in the art can make various alteration and modification within the scope of the claims, without affecting the substantial content of the present disclosure.

What is claimed is:

1. A display device comprising a plurality of color sub-pixels, the display device comprising:
    a substrate module comprising a TFT driving substrate and an insulating layer formed over the TFT driving substrate;
    a pixel definition layer formed over the insulating layer, the pixel definition layer comprising a plurality of openings; and
    an organic light emitting layer and a pixel electrode formed in the plurality of openings to correspondingly form a plurality of sub-pixels,
    wherein a three-dimensional recess is disposed in the insulating layer below at least one sub-pixel having a particular color, each three-dimensional recess corresponds to an opening of the pixel definition layer, and the organic light emitting layer and the pixel electrode are formed on the entire surface of each three-dimensional recess, to correspondingly form the plurality of sub-pixels, and a surface area of the organic light emitting layer and the pixel electrode is larger than a projected area of the three-dimensional recess on the pixel definition layer.

2. The display device of claim 1, further comprising a transparent conductive layer formed at a surface of the insulating layer, the transparent conductive layer comprising an opening region of the transparent conductive layer and a non-opening region of the transparent conductive layer, the opening region of the transparent conductive layer being disposed in the plurality of openings of the pixel definition layer, and the non-opening region of the transparent conductive layer being disposed between the insulating layer and the pixel definition layer, wherein in each three-dimensional recess, the opening region of the transparent conductive layer is affixed to a surface of the three-dimensional recess, and a portion of the transparent conductive layer in the three-dimensional recess has a surface area larger than a surface area of a corresponding opening of the pixel definition layer.

3. The display device of claim 2, wherein the insulating layer comprises a planarization layer, and the three-dimensional recess does not penetrate the planarization layer.

4. The display device of claim 2, wherein the insulating layer comprises a planarization layer and a passivation layer, and the planarization layer is formed over the passivation layer.

5. The display device of claim 4, wherein the three-dimensional recess does not penetrate the planarization layer.

6. The display device of claim 4, wherein the three-dimensional recess penetrates the planarization layer, but does not penetrate the passivation layer.

7. The display device of claim 1 wherein the plurality of sub-pixels comprises a red sub-pixel, a green sub-pixel and a blue sub-pixel, a respective color sub-pixel corresponds to a respective three-dimensional recess of a respective surface area and each of the sub-pixels has the same voltage value.

8. The display device of claim 7, wherein the red sub-pixel corresponds to a three-dimensional recess having a surface area larger than a surface area of a three-dimensional recess corresponding to the green sub-pixel.

9. The display device of claim 8, wherein the green sub-pixel corresponds to a three-dimensional recess having a surface area larger than a surface area of a three-dimensional recess corresponding to the blue sub-pixel.

10. The display device of claim 7, wherein for a color sub-pixel, a current (I), a voltage (V), a current density (J) and an area (S) of a light emitting region have the following relationships: $J=F(V)$, $I=JS$, wherein $J=F(V)$ corresponds to a curve of current density against voltage, and a value of the current of the color sub-pixel is a determinable current value of a sub-pixel of an organic light emitting device of a certain type; and a relationship among the area (S) of the light emitting region, the current (I) and the voltage (V) is $S=[I/F(V)]$, and based on the relationship among the area (S) of the light emitting region, the current (I) and the voltage (V), a surface area of each of the sub-pixels can be determined according to a set voltage.

11. The display device of claim 1, wherein the three-dimensional recess is formed of at least one recess of any one form of an inverted trapezoidal groove, a triangular groove, an inverted pyramid-shaped recess, an inverted bevel recess, an inverted vertebral recess and a hemisphere recess.

* * * * *